United States Patent
Larson et al.

(10) Patent No.: US 6,263,542 B1
(45) Date of Patent: Jul. 24, 2001

(54) TOLERANCE RESISTANT AND VACUUM COMPLIANT DOOR HINGE WITH OPEN-ASSIST FEATURE

(75) Inventors: Dean Jay Larson, Mountain View; Thomas R. Sutton, Fremont, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/338,008

(22) Filed: Jun. 22, 1999

(51) Int. Cl.[7] .................................................. H01L 21/34
(52) U.S. Cl. ................................ 16/321; 16/289; 16/306; 251/193; 49/386
(58) Field of Search .............................. 16/321, 308, 307, 16/304, 50, 289, 290, 306; 251/301, 193; 49/386; 386/16

(56) References Cited

U.S. PATENT DOCUMENTS

| | | | |
|---|---|---|---|
| 3,789,875 | 2/1974 | McGee | 137/553 |
| 4,340,462 | 7/1982 | Koch | 204/298.35 |
| 4,355,937 | 10/1982 | Mack et al. | 414/217 |
| 4,483,654 | 11/1984 | Koch et al. | 414/744.5 |
| 4,593,915 | 6/1986 | Seger et al. | 277/643 |
| 4,650,207 | * 3/1987 | Ackermann | 280/515 |
| 4,715,764 | 12/1987 | Hutchinson | 414/217 |
| 4,721,282 | 1/1988 | Shawver et al. | 251/62 |
| 4,747,577 | 5/1988 | Dimock | 251/158 |
| 4,753,417 | 6/1988 | Madocks et al. | 251/158 |
| 4,795,299 | 1/1989 | Boys et al. | 414/217 |
| 4,804,086 | 2/1989 | Grohrock | 206/710 |
| 4,917,556 | 4/1990 | Stark et al. | 414/217 |
| 5,002,255 | 3/1991 | Sawa et al. | 251/193 |
| 5,003,347 | * 3/1991 | Kameda | 355/75 |
| 5,072,257 | * 12/1991 | Stoesser et al. | 355/93 |
| 5,076,205 | 12/1991 | Vowles et al. | 118/719 |
| 5,100,276 | 3/1992 | Iwasaki et al. | 414/222.06 |
| 5,120,019 | 6/1992 | Davis, Jr. | 251/193 |
| 5,150,882 | 9/1992 | Kaneko | 251/193 |

(List continued on next page.)

FOREIGN PATENT DOCUMENTS

| | | | |
|---|---|---|---|
| WO 92/02950 | 2/1992 | (EP) | H01L/21/00 |
| 591085A1 | 6/1994 | (EP) | H01L/21/00 |
| 11-101345 | 4/1999 | (JP) | F16J/13/18 |
| 1093854 | 5/1984 | (SU) | F16K/3/18 |
| WO 99/03135 | 1/1999 | (WO) | H01L/21/00 |

*Primary Examiner*—Anthony Knight
(74) *Attorney, Agent, or Firm*—Martine & Penilla, LLP

(57) ABSTRACT

A hinge assembly and methods for mounting a hatch relative to a port defined in a cover of a vacuum chamber to close and open the port. A torsion rod mounted between the port and the hatch is in torsion when the hatch is in a closed position relative to the port, assisting port-opening motion. A sleeve surrounds the rod and is movable with the hatch. Friction hinge structures between the cover and the sleeve, and between the hatch and a second sleeve are in a friction-engaging relationship with the corresponding sleeve. Each friction hinge structure provides high resistance to relative motion between a friction spring and the corresponding sleeve. During the port-opening motion of the hatch the friction springs provide low resistance to such relative motion. The hinge structures provide tolerance resistance and vacuum compliance by allowing relative movement between a hinge mounting plate and the hatch. During vacuum pumping, the hinges allow the hatch to move from an O-ring pre-load position, to an intermediate position, and then to a final position so that the pre-loaded O-ring compresses to an operational O-ring compression. Since the hinges permit the O-ring pre-load position to exist prior to vacuum operation and under all variations of certain manufacturing tolerances, the full range of relative motion between the plate and the hatch is permitted, such that the sealing surfaces seal in a tolerance resistance and vacuum compliant manner.

20 Claims, 16 Drawing Sheets

U.S. PATENT DOCUMENTS

| | | | |
|---|---|---|---|
| 5,383,338 | 1/1995 | Bowsky et al. | 62/125 |
| 5,667,197 | 9/1997 | Boyd et al. | 251/193 |
| 5,697,749 | 12/1997 | Iwabuchi et al. | 414/217 |
| 5,769,952 | 6/1998 | Komino | 118/733 |
| 5,771,540 * | 6/1998 | Carpenter et al. | 16/308 |
| 5,787,549 * | 8/1998 | Soderlund | 16/308 |
| 5,902,088 | 5/1999 | Fairbairn et al. | 414/217 |

* cited by examiner

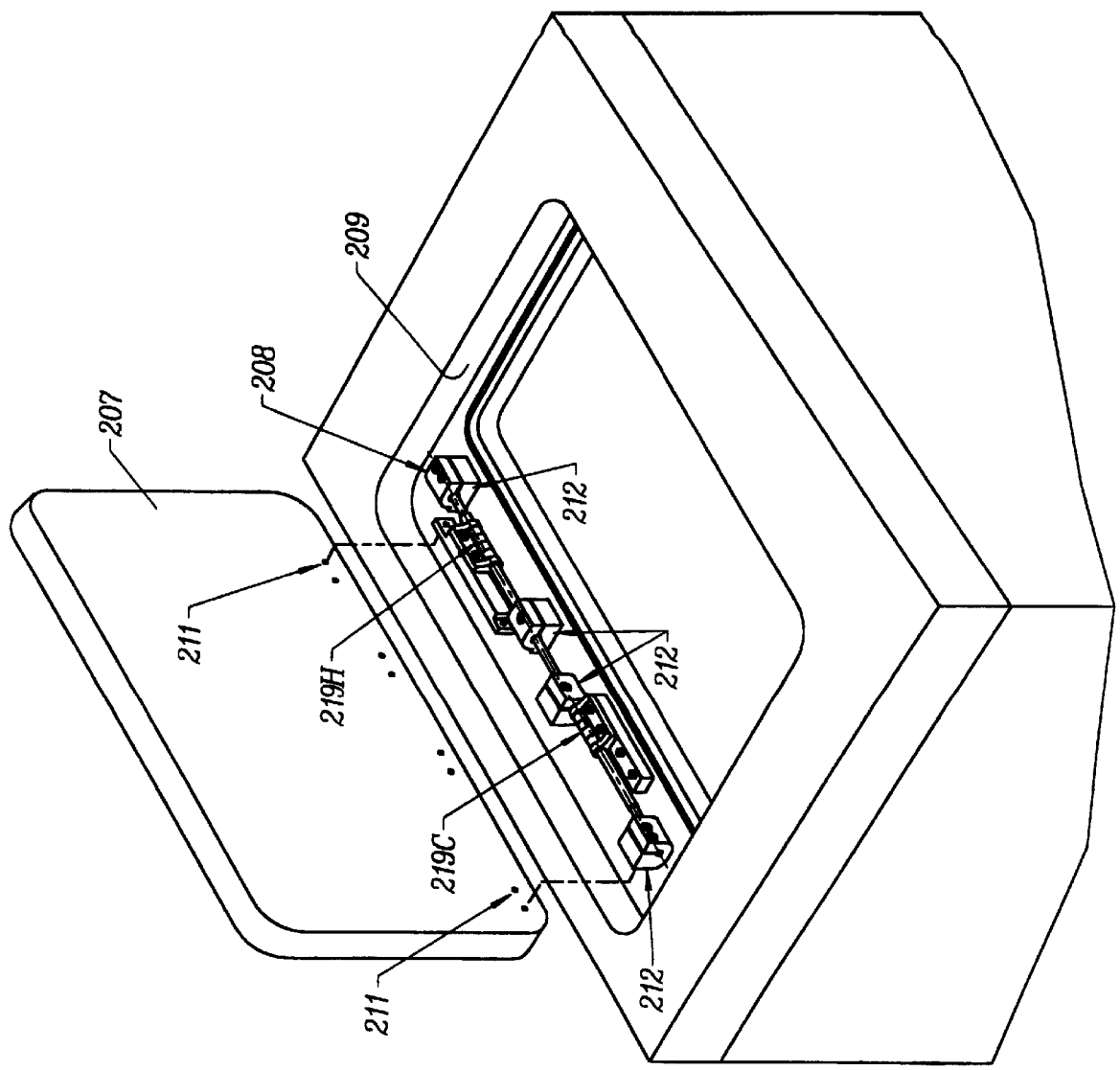

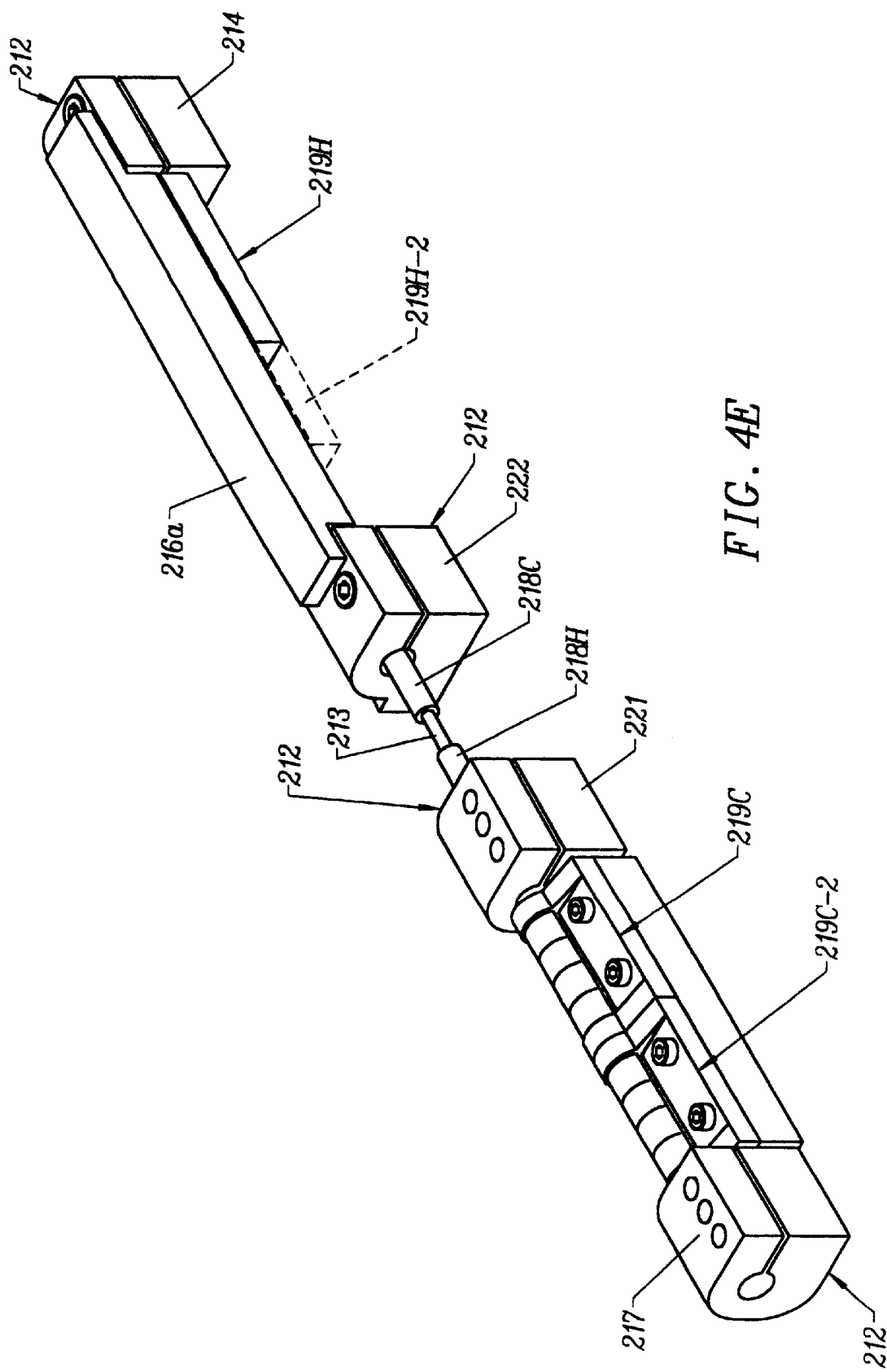

TOLERANCE RESISTANT AND VACUUM COMPLIANT DOOR HINGE WITH OPEN-ASSIST FEATURE

BACKGROUND OF THE INVENTION

1. Field of the Invention

The present invention relates generally to doors for modules of semiconductor processing equipment, and more particularly to tolerance resistant and vacuum compliant door hinges having open assist features.

2. Description of the Related Art

In the manufacture of semiconductor devices, process chambers are interfaced to permit transfer of wafers, for example, between the interfaced chambers. Such transfer is via transport modules that move the wafers, for example, through slots or ports that are provided in the adjacent walls of the interfaced chambers. For example, transport modules are generally used in conjunction with a variety of substrate processing modules, which may include semiconductor etching systems, material deposition systems, flat panel display etching systems, etc. Due to the growing demands for cleanliness and high processing precision, there has been a growing need to reduce the amount of human interaction during and between processing steps. This need has been partially met with the implementation of transport modules which operate as an intermediate handling apparatus (typically maintained at a reduced pressure, e.g., vacuum conditions). By way of example, a transport module may be physically located between one or more clean room storage facilities where substrates are stored, and multiple substrate processing modules where the substrates are actually processed, e.g., etched or have deposition performed thereon. In this manner, when a substrate is required for processing, a robot arm located within the transport module may be employed to retrieve a selected substrate from storage and place it into one of the multiple processing modules.

As is well known to those skilled in the art, the arrangement of transport modules to "transport" substrates among multiple storage facilities and processing modules is frequently referred to as a "cluster tool architecture" system. FIG. 1A depicts a typical semiconductor process cluster architecture 100 illustrating the various chambers that interface with a transport module 106. Transport module 106 is shown coupled to three processing modules 108a–108c which may be individually optimized to perform various fabrication processes. By way of example, processing modules 108a–108c may be implemented to perform transformer coupled plasma (TCP) substrate etching, layer depositions, and/or sputtering.

Connected to transport module 106 is a load lock 104 that may be implemented to introduce substrates into transport module 106. Load lock 104 may be coupled to a clean room 102 where substrates are stored. In addition to being a retrieving and serving mechanism, load lock 104 also serves as a pressure-varying interface between transport module 106 and clean room 102. Therefore, transport module 106 may be kept at a constant pressure (e.g., vacuum), while clean room 102 is kept at atmospheric pressure. The processing modules 108a–108c are generally positioned very close to the transport module 106, and each tends to block physical access to the transport module 106 by service personnel who need to access the transport module 106 via a cover 109 of the transport module 106. Thus, in many cases there is only a narrow passageway extending between adjacent processing modules 108a–108c to the transport module 106. As a result, there is a significant limitation on the physical force that an operator can exert on a hatch 111 of the cover 109, such as for opening the hatch 111. Since ergonomic specifications assume that the service personnel are able to exert thirty pounds of force to open the hatch, the narrowness of the passageway may make it very difficult to open the hatch without mechanical or other non-human assistance.

One type of cover 109 is shown in FIG. 1B provided with the hatch 111 mounted on a fixed hinge 114. The hatch 111 has a hatch sealing surface 116 designed to seal when it is parallel to a cover sealing surface 117. The hatch 111 rotates on a pin 118, but depending on various manufacturing tolerances, the final rotational movement of the hatch 111 may not position the hatch sealing surface 116 parallel to the cover sealing surface 117. Thus, an angle X may result, such that an O-ring 119 between the hatch 111 and cover sealing surface 117 will be unevenly squeezed. As the hatch 111 moves further toward the cover 109 as a vacuum is drawn in the vacuum chamber that is to be closed by the cover 109, the angle X may increase, and result in an improper seal.

In an attempt to avoid such problems with the non-parallel sealing surfaces 116 and 117, and to comply with the ergonomic specifications, some have held a sealing surface 116 parallel to a cover sealing surface 117 using an air or hydraulic cylinder 121 which may raise or lower the hatch 111 out of or into sealing relationship with the cover 109. As noted, the ergonomic specifications require that hatches weighing more than 30 pounds be provided with mechanical or other non-human assistance to open the hatch 111. Thus, if the cylinder 121 reduces to less than thirty pounds the force that a human must exert to open the hatch 111, the cylinder 121 meets these specifications. However, as shown in FIG. 1C, the cylinders 121 are generally mounted in positions near the hatch 111, and may block access to a port 122 and to the inside of the vacuum chamber once the hatch 111 has been opened. Also, these cylinders 121 tend to be costly, and are generally used where it is desired to lift the entire cover 109, rather than only the hatch 111. Further, safety precautions may require that both hands of the service personnel be away from the hatch 111 during operation of the cylinder 121. Because the hatch 111 may weigh thirty-five or fifty pounds, for example, once the hatch 111 has been opened, safety requirements provide that a latch must be used to prevent sudden closing of the hatch 111.

To avoid the limitations of such cylinders 121, some have pivotally mounted the entire cover 109 as shown, for example, in FIG. 1D, for motion from a closed (C) position to an open (O) position. However, in addition to having to move the greater weight of the cover 109 (e.g., 500 pounds) as compared to the lesser weight of the hatch 111, the larger size cover 109 tends to block access to electrical panels 123, for example.

In view of the forgoing, what is needed is a hatch for covers of modules of semiconductor processing equipment, where the hatch is mounted by hinges that are tolerance resistant, vacuum compliant, and have open-assist features.

SUMMARY OF THE INVENTION

Broadly speaking, the present invention fills these needs by providing a hatch for a cover of a module of semiconductor processing equipment, where the hatch is mounted by hinges that are tolerance resistant, vacuum compliant, and have open-assist features. The tolerance resistance may be provided by separating a hinge body from the hatch by a vacuum compliant connection which permits a sealing surface of the hatch to sealingly seat relative to a cover sealing surface notwithstanding manufacturing tolerances. Further, the open-assist feature may be provided in conjunction with the hinge body that mounts the hatch relative to a port defined in the cover.

These aspects of the present invention may be provided by a torsion rod mounted between the port and the hatch. The torsion rod is in torsion when the hatch is in a closed position relative to the port to assist port-opening motion of the hatch. Also, for example, one sleeve surrounds the torsion rod and is movable with the hatch. Friction hinge structures are between the cover and the one sleeve, the hinge structures being in a friction-engaging relationship with the one sleeve to resist port-closing motion of the hatch. Another sleeve surrounds the rod and is fixed to the cover. Additional friction hinge structures are between the hatch and the other sleeve, and these hinge structures are also in a friction-engaging relationship with the other sleeve to further resist port-closing motion of the hatch.

Another aspect of the present invention may be provided by a method of making a hinge assembly for mounting the hatch relative to the port defined in the cover of the vacuum chamber. An operation of the method may include mounting a torsion rod between the port and the hatch with the rod in torsion when the hatch is in a closed position relative to the port to assist port-opening motion of the hatch. Another operation is mounting one sleeve surrounding the rod, and placing at least one friction hinge structure between the cover and the one sleeve in a friction-engaging relationship with the one sleeve to resist port-closing motion of the hatch. Other operations include mounting additional friction hinge structures between the hatch and another sleeve. These additional hinge structures are also in a friction-engaging relationship with the other sleeve to further resist port-closing motion of the hatch.

As a result of the tolerance resistance, as the hatch is closed and the sealing surface of the hatch closely approaches the cover sealing surface, the hatch sealing surface may stay parallel to the cover sealing surface notwithstanding manufacturing tolerances. In this manner, the O-ring is uniformly compressed prior to drawing a vacuum in the chamber. The vacuum compliant feature may thus be achieved in that further compression of the O-ring under vacuum properly brings the respective sealing surfaces into sealing contact.

It may be understood, then, that the hinges of the present invention that are tolerance resistant, vacuum compliant, and have open-assist features avoid the abovenoted disadvantages of the cover shown in FIG. 1B provided with a hatch mounted on a fixed hinge. In particular, because the tolerance compliant connection permits the sealing surface of the hatch to sealingly seat relative to the cover sealing surface notwithstanding manufacturing tolerances, the hatch sealing surface is parallel to the cover sealing surface as it moves into contact with and compresses the O-ring. Further, such parallel positioning is achieved without the locational, cost, and safety disadvantages of the prior art. Also, the advantages of the present invention avoid the limitations of the pivotally mounted covers shown in FIG. 1D.

Other aspects and advantages of the present invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

FIG. 4A is a more detailed perspective view of one of the hatches shown in FIG. 3, illustrating the hatch held in an open position with the assistance of friction hinge structures and a torsion rod in torsion when the hatch is in a closed position.

FIG. 4E is a perspective view taken along lines 4E—4E in FIG. 4D showing an embodiment having two friction hinge structures at one end of the torsion rod.

DETAILED DESCRIPTION OF THE PREFERRED EMBODIMENTS

An invention is described for supporting a hatch which provides access to a port of a vacuum chamber, wherein the hatch support is tolerance resistant and vacuum compliant, while having open-assist features. The invention is described in terms of hatches for modules of semiconductor processing equipment, and more particularly to hatches supported by hinges that are tolerance resistant and vacuum compliant, while assisting opening of the hatch. It will be obvious, however, to one skilled in the art, that the present invention may be practiced without some or all of these specific details. In other instances, well known process operations have not been described in detail in order not to obscure the present invention.

Figure 1A:
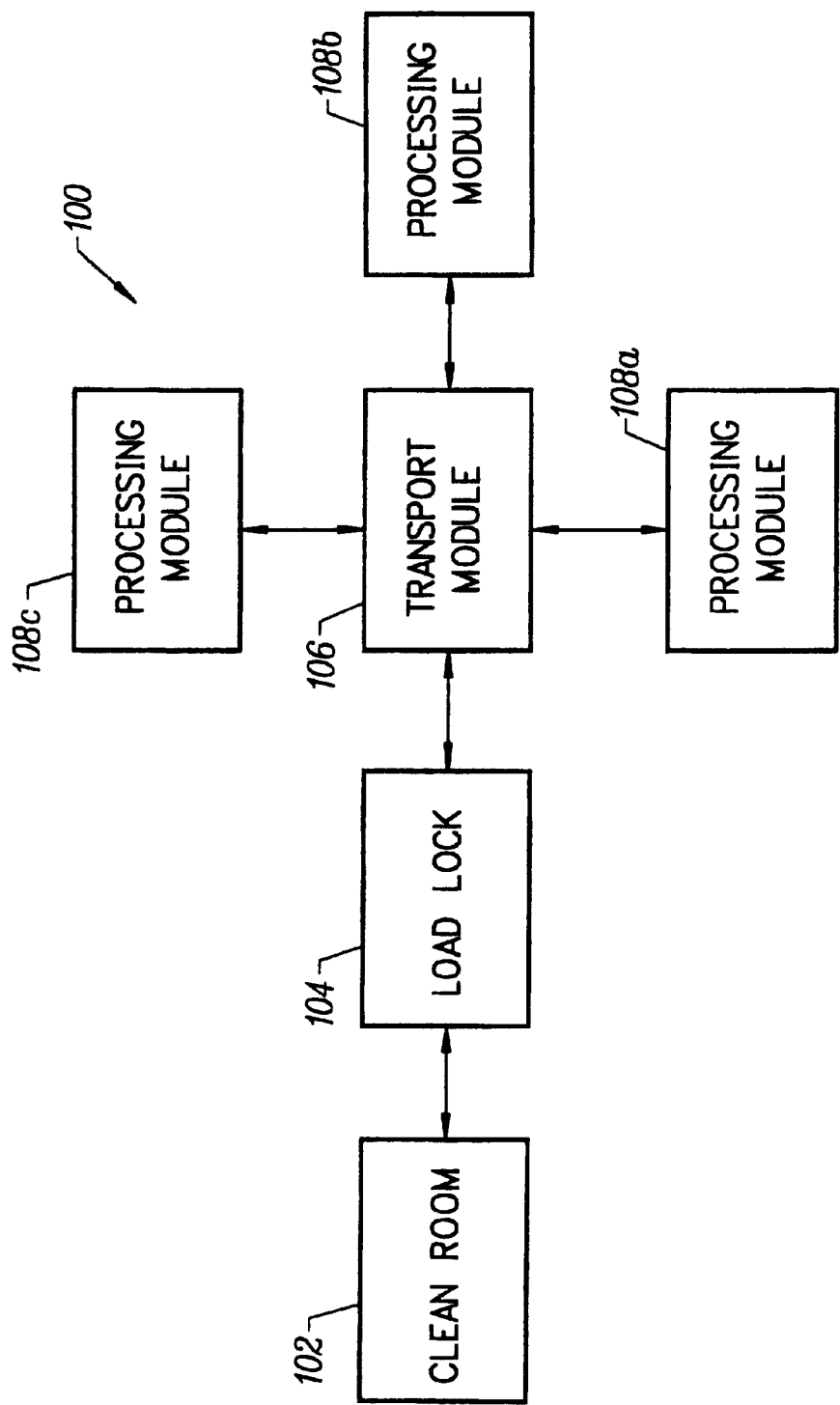
FIG. 1A depicts a typical prior art semiconductor process cluster architecture illustrating various chambers that interface with a transport module.
Figure 1B:
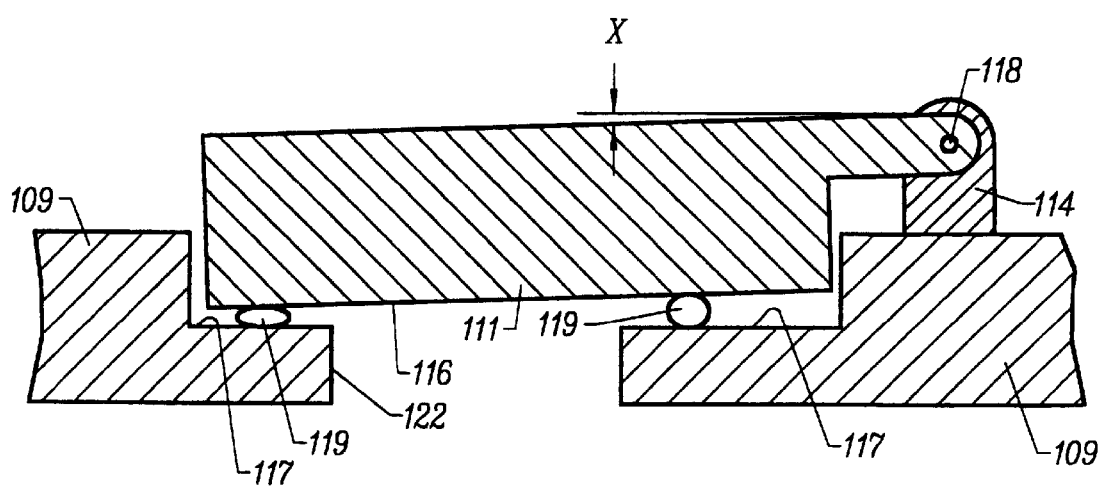
FIG. 1B illustrates one type of chamber cover provided with a hatch mounted on a fixed hinge.
Figure 1C:
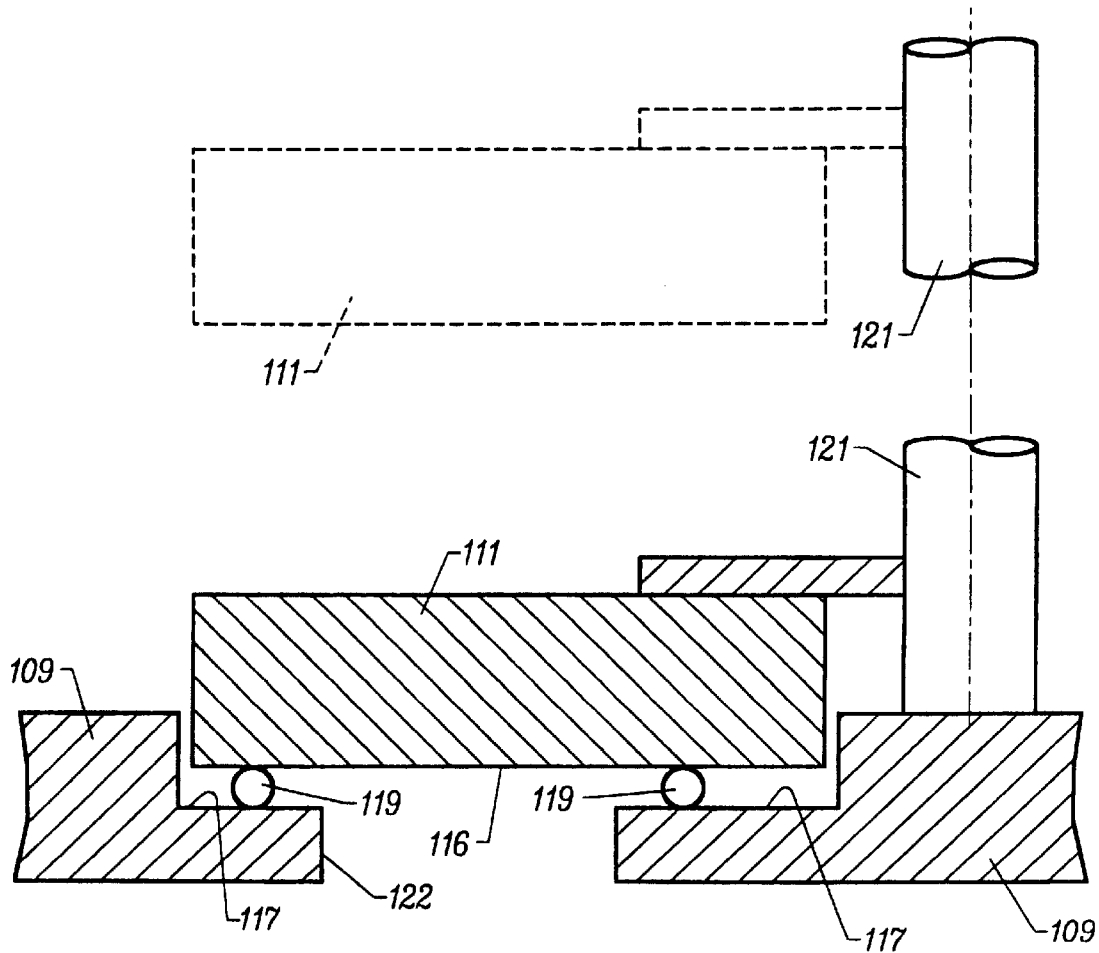
FIG. 1C shows a hatch sealing surface held parallel to a cover sealing surface by a prior art air or hydraulic cylinder which may raise or lower the hatch out of or into sealing relationship with the cover.
Figure 1D:
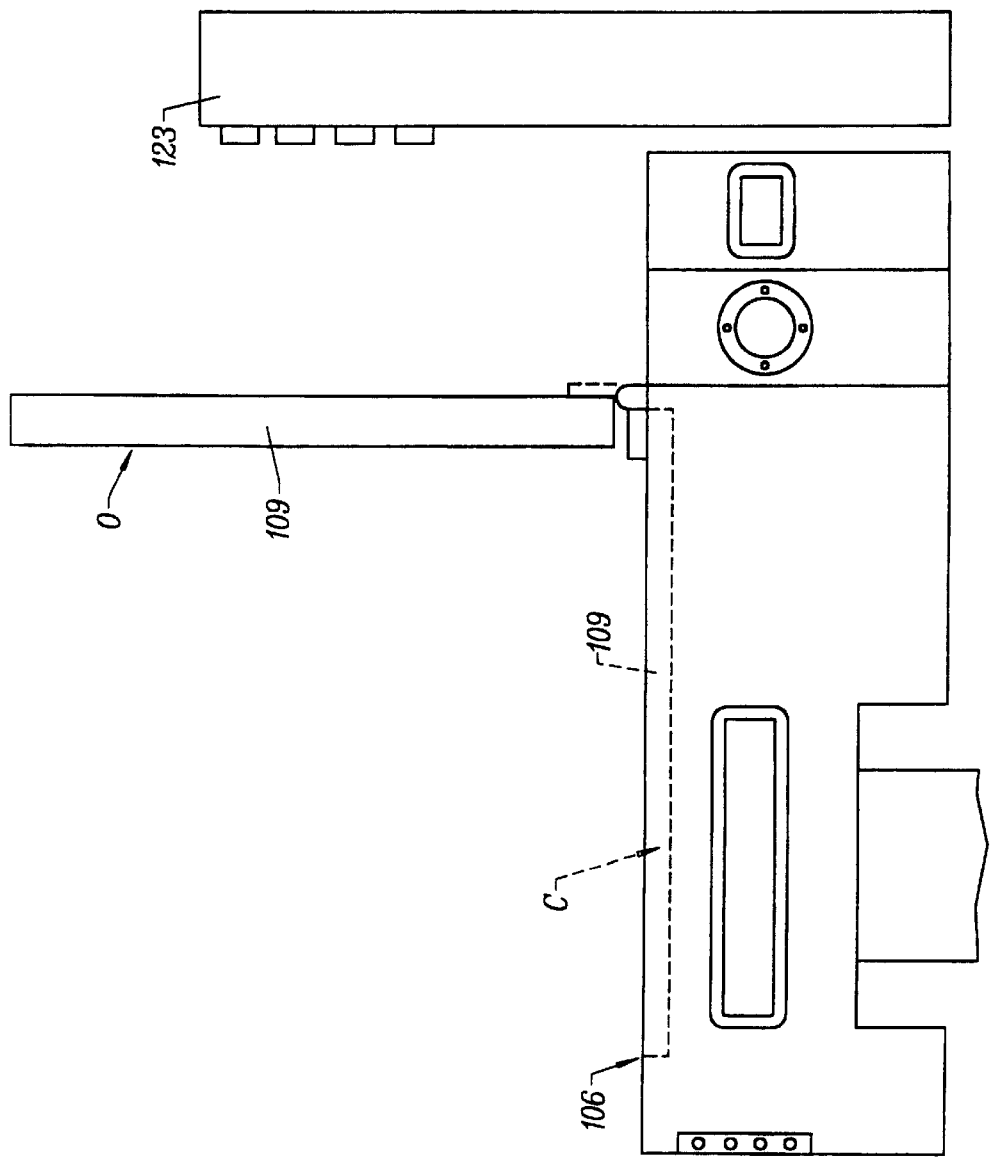
FIG. 1D illustrates a prior art pivotal mounting of an entire cover of a vacuum chamber, with the closed cover shown in dashed lines and the open cover shown in solid lines tending to block access to an electrical panel, for example.
Figure 2:
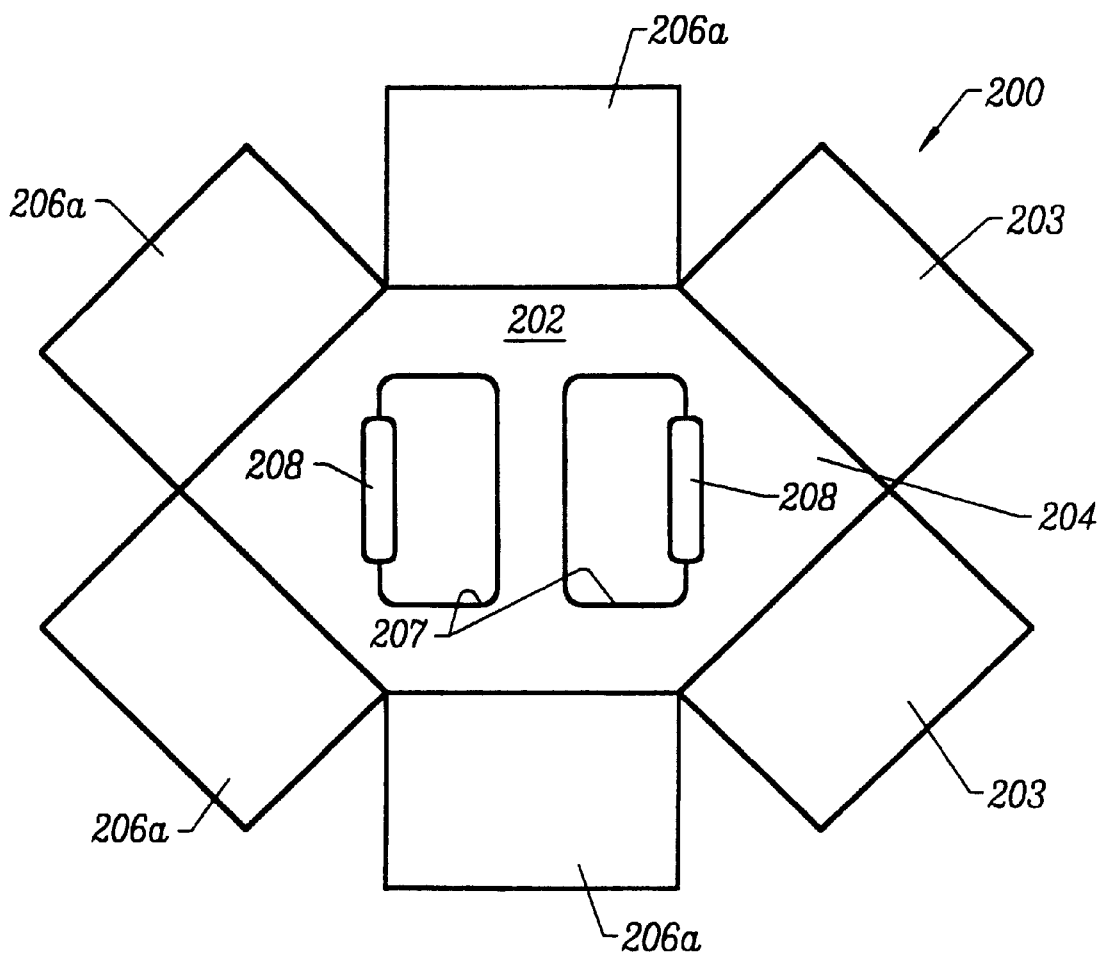
FIG. 2 is a schematic diagram of a cluster tool architecture including a transport module provided with hatches for a cover of the module, where the hatches are mounted by hinges of the present invention that are tolerance resistant, vacuum compliant, and have open-assist features.

Referring to FIG. 2, the invention is generally described as including a semiconductor process cluster architecture 200 having a transport module 202, load locks 203, and process modules 206a, wherein a cover 204 of the transport module 202 is provided with hatches 207 to facilitate accessing the interior of the transport module 202. Considering FIG. 2 as a plan view, access to the hatches 207 of the transport module 202 is seen limited by the size and positioning of the load locks 203 and the processing modules 206a. It may be understood that such size and positioning may be primarily dictated by considerations other than the manner in which access is to be provided to the hatches 207 of the module 202. The individual hatches 207 are provided with hinge assemblies 208 designed to be tolerance resistant and vacuum compliant, while assisting in the opening of the hatches 207. The hinge assemblies 208, for example, minimize the effort that must be expended by personnel who service the module 202 of the architecture 200. As a result, the size and location of each individual module 202, 203 or 206a have a less significant impact on efforts to service the modules 202, for example.

Figure 3:
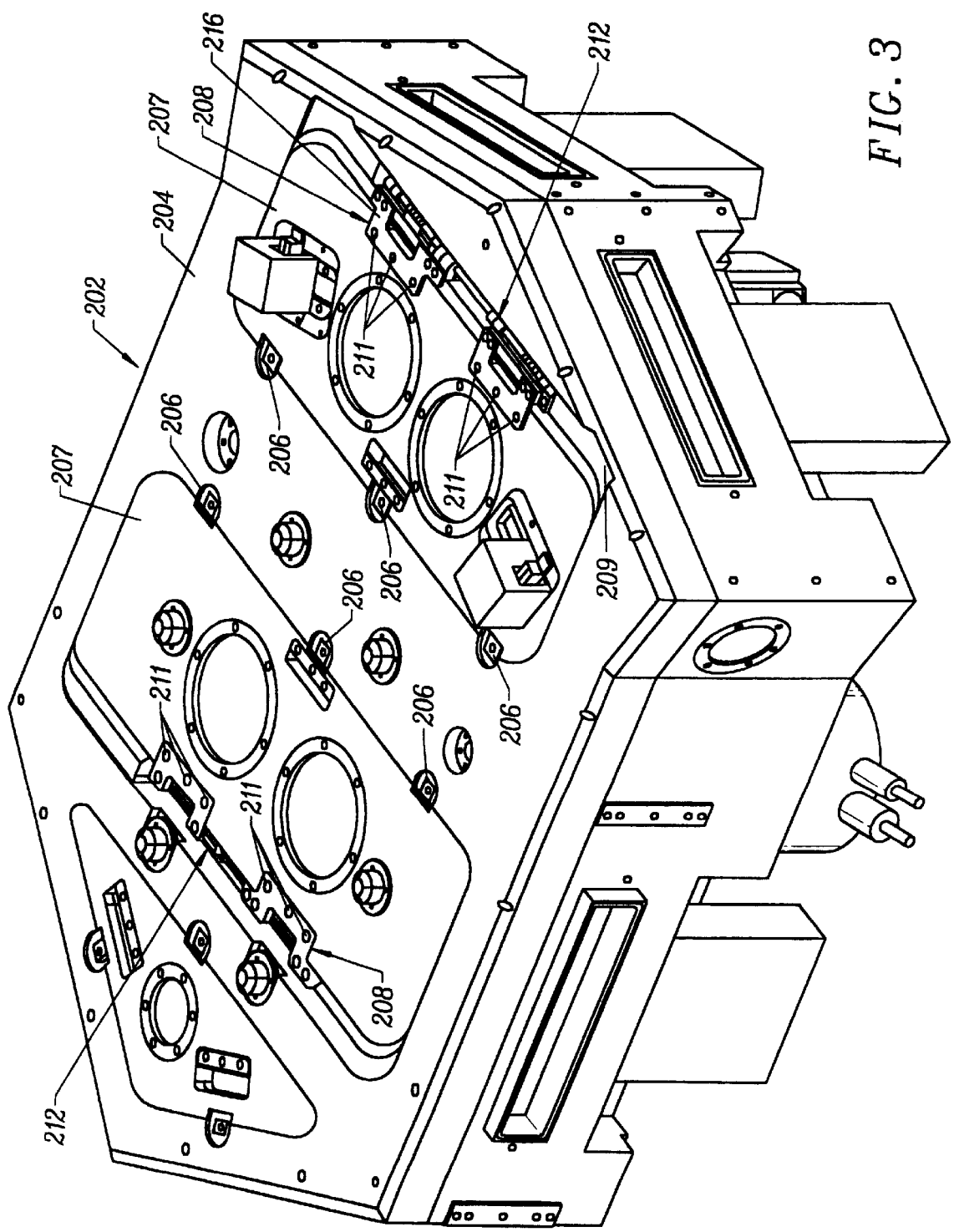
FIG. 3 is a perspective view of the transport module provided with two of the hatches for a cover of the module, each of the hatches being shown mounted by a hinge of the present invention.

FIG. 3 shows the transport module 202 provided with the cover 204 having claw clamps 206 and two of the hatches 207 mounted by the hinge assemblies 208 of the present invention to permit access to the interior of the transport module 202. As shown, top surfaces of the cover 204 and the hatches 207 are flush with each other to provide a relatively smooth surface on which the service personnel may kneel, for example, as they perform service operations. Since the hinge assemblies 208 are oriented in opposite directions, in the following descriptions reference will be made to the hinge assembly 208 shown on the left of FIG. 3, and it should be understood that the description is applicable to the other hinge assembly 208 if it is viewed from the left of the transport module 202.

Figure 4B:
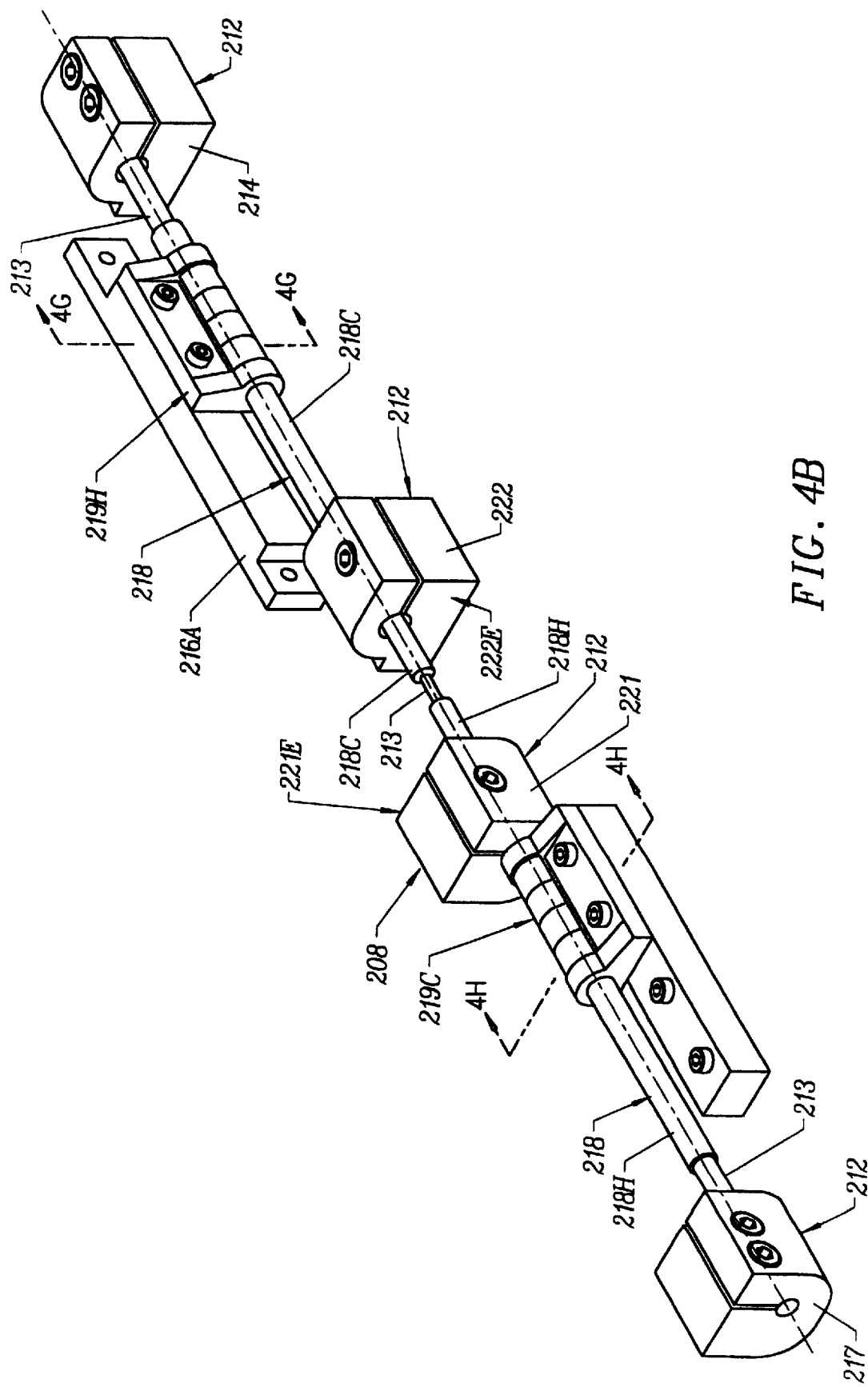
FIG. 4B is a detailed perspective view taken along lines 4B—4B in FIG. 4D, showing two of the friction hinge structures and the torsion rod.
Figure 4C:
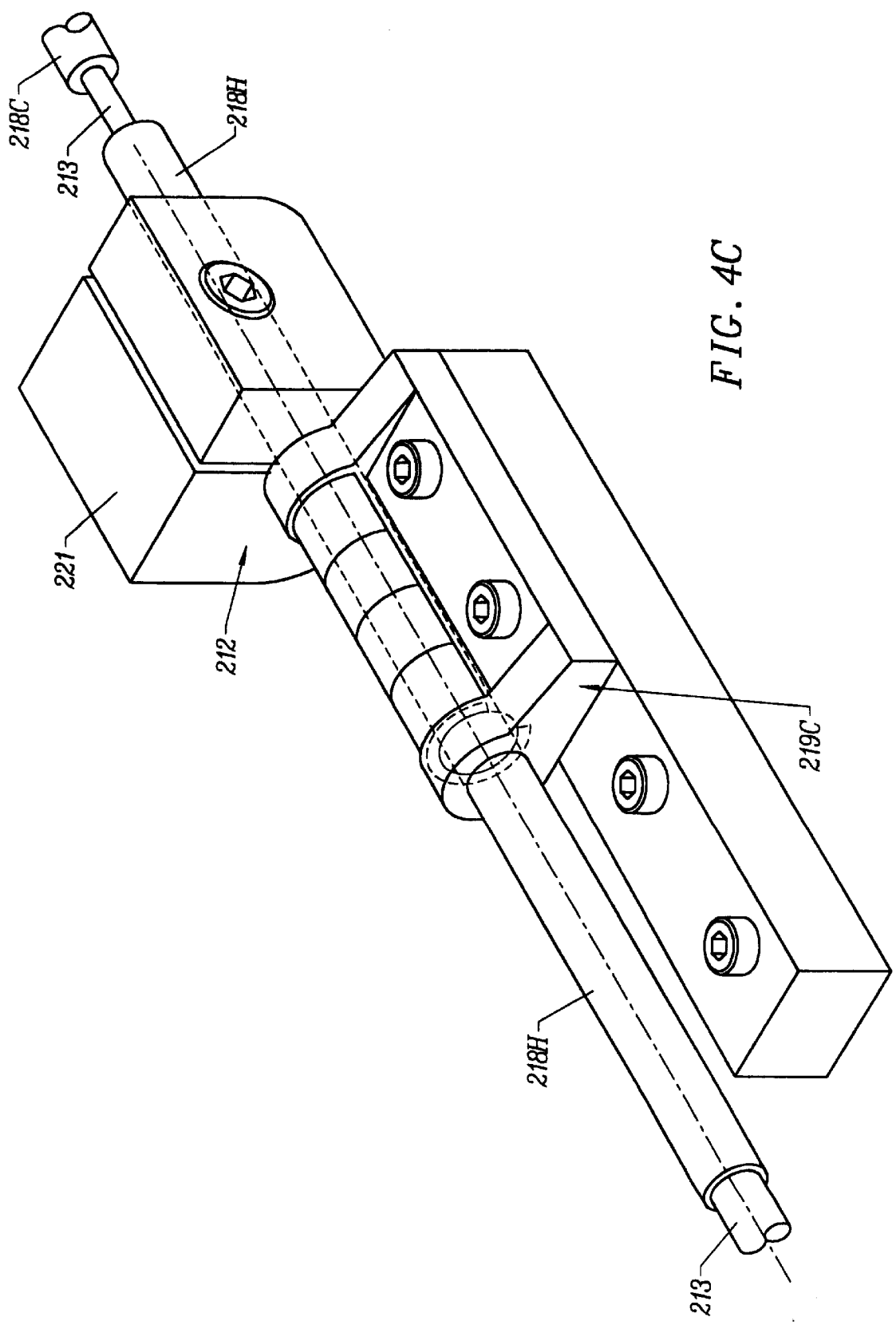
FIG. 4C is an enlarged perspective view of one of the friction hinge structures engaging a sleeve mounted on the torsion rod.
Figure 4D:
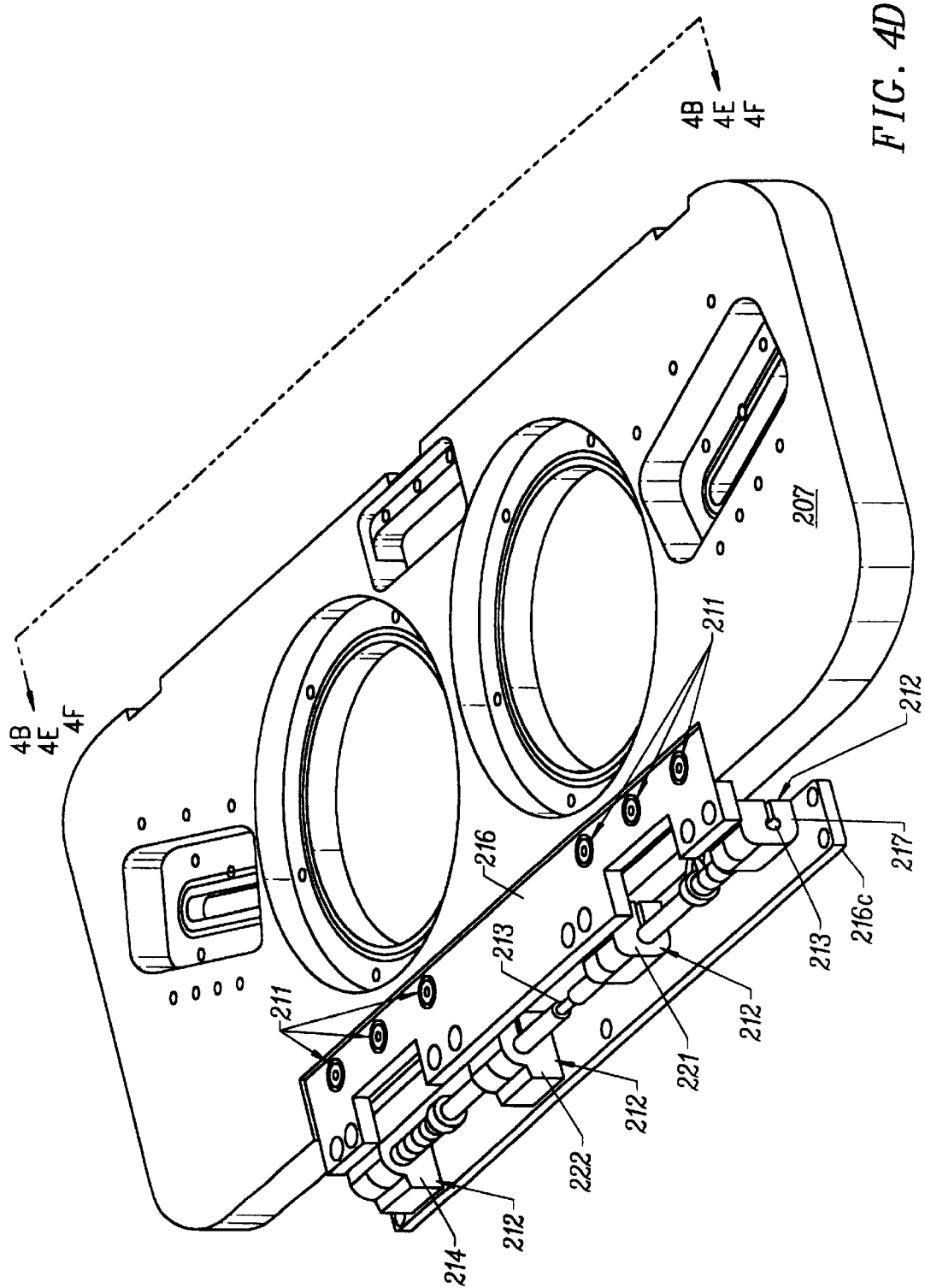
FIG. 4D is a perspective view showing an intermediate plate between the friction hinge structures and the hatch.
Figure 4F:
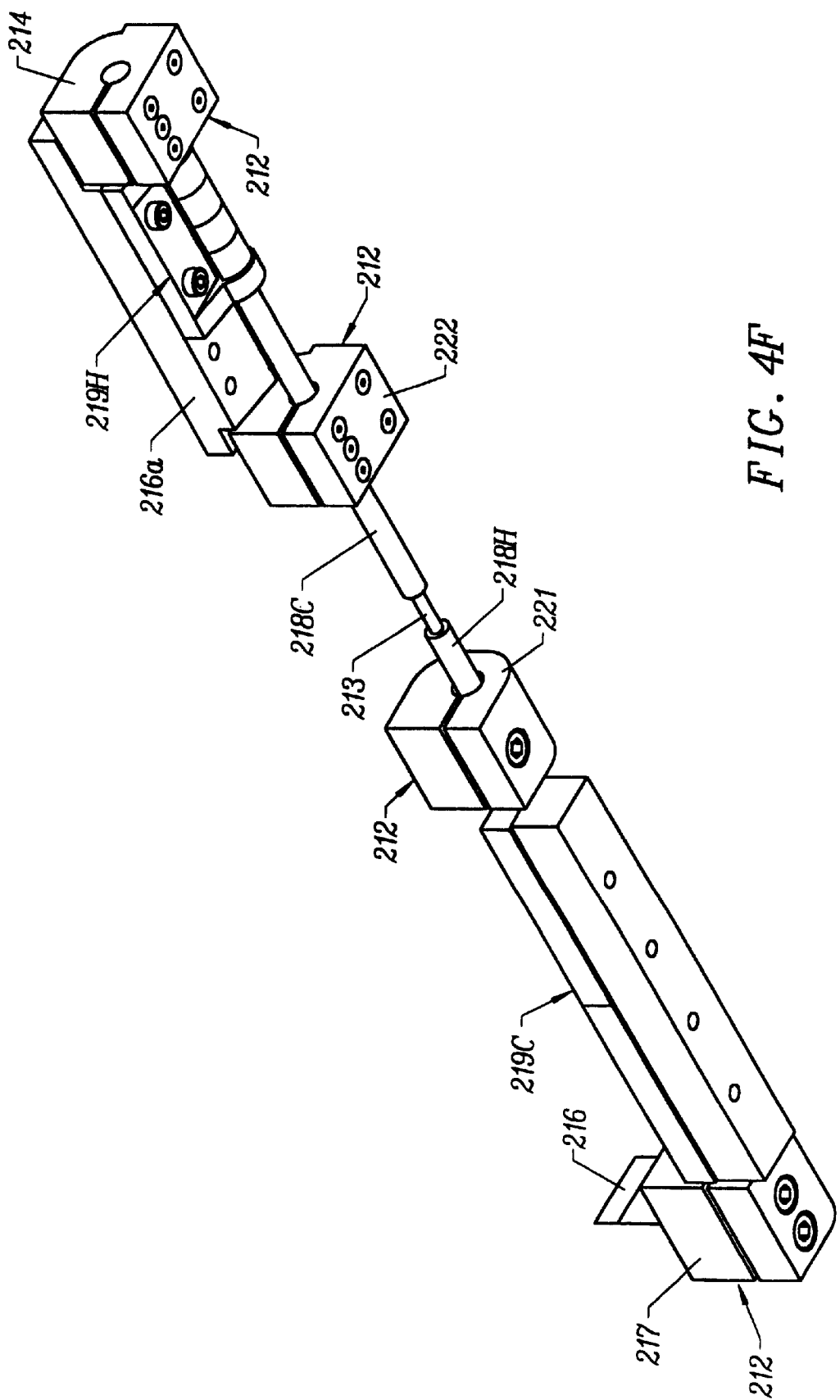
FIG. 4F is a view similar to FIG. 4E showing the underside of the two friction hinge structures at one end of the torsion rod.

The hatches 207 are shown in a closed position in FIGS. 3 and 4D to seal a port 209 through which the interior of a vacuum chamber of the transport module 202 is accessed when the hatch 207 is open. Movement of the hatches 207 is facilitated by the hinge assemblies 208. Each hinge assembly 208 includes tolerance resistant and vacuum compliant connections, or connectors, 211 which under vacuum conditions of the chamber permit the hatch 207 to sealingly seat relative to the cover 204 notwithstanding manufacturing tolerances. Additionally, an open-assist feature of each of the hinge assemblies 208 is provided in conjunction with hinge bodies 212 assembled with a torsion rod 213. The torsion rod 213 is in torsion when the hatch 207 is in the closed position shown in FIGS. 3 and 4D relative to the port 209 to assist port-opening motion of the hatch 207 to an open hatch position shown in FIG. 4A.

As shown in FIGS. 4B and 4D, one end of the torsion rod 213 (the right end viewed in FIG. 4B and the left end viewed in FIG. 4D) is held fixed to the cover 204 by a first rod clamp 214 so that the one end of the rod 213 does not rotate when the hatch 207 is moved to or from the closed position. The other end of the torsion rod 213 (the left end viewed in FIG. 4B and the right end viewed in FIG. 4D) is held fixed to an intermediate hatch mounting plate 216 by a second rod clamp 217 so that that end of the rod 213 does rotate when the hatch 207 is moved to or from the closed position. To place the torsion rod 213 in torsion when the hatch 207 is in the closed position shown in FIGS. 3 and 4D relative to the port 209, the second rod clamp 217 is loose relative to the rod 213 and the hatch 207 is moved to the open position (FIG. 4A). The second rod clamp 217 is then tightened against the rod 213 so that as the hatch 207 is moved from the open position (FIG. 4A) to the closed position (FIG. 4D) the rod 213 is twisted and placed in torsion. The rod 213 is designed to provide torsional force (assisting movement of the hatch 207 to the open position and resisting the return movement of the batch 207 to the closed position) that is linear with respect to the angular position of the hatch 207 on the longitudinal axis of the rod 213.

As shown, in FIGS. 4A and 4B, each hinge assembly 208 also includes sleeves 218 and friction hinge structures 219. One sleeve (referred to as the hatch sleeve 218H and shown on the left in FIG. 4B) surrounds a left portion of the torsion rod 213. A hatch-sleeve clamp 221 secures the sleeve 218H to the hatch 207 for movement with the hatch 207. One friction hinge structure 219C is secured to the cover 204 between the cover 204 and the one sleeve 218H in friction-engaging relationship with the one sleeve 218H. As the sleeve 218H rotates with the hatch 207 (i.e., clockwise as shown in FIGS. 4B and 4H, see allow A1) the friction-engaging relationship resists port-closing motion of the hatch 207.

Figure 4G:
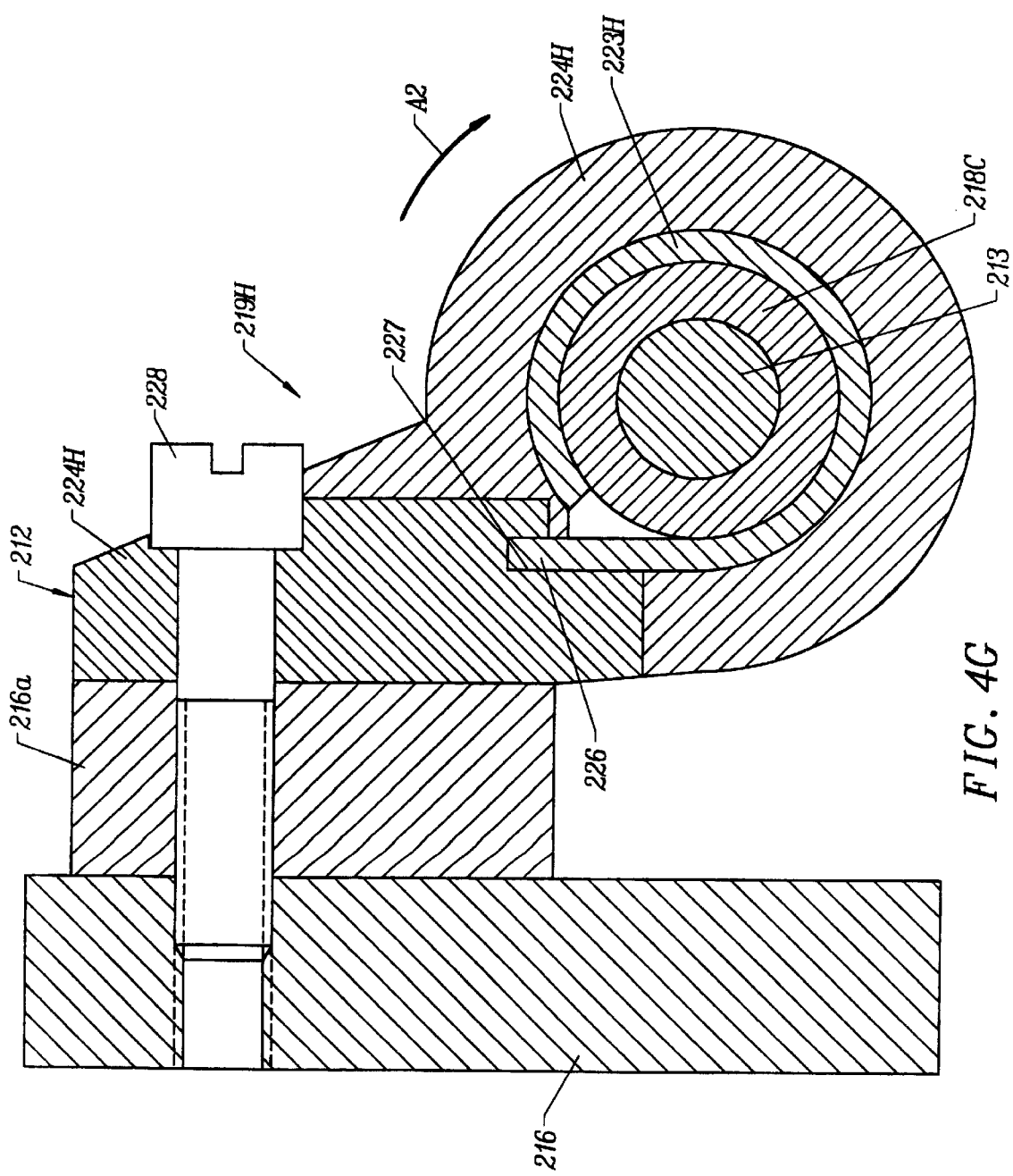
FIG. 4G is a cross sectional view of one of the friction hinge structures showing a friction spring engaging a sleeve mounted on the torsion rod.
Figure 4H:
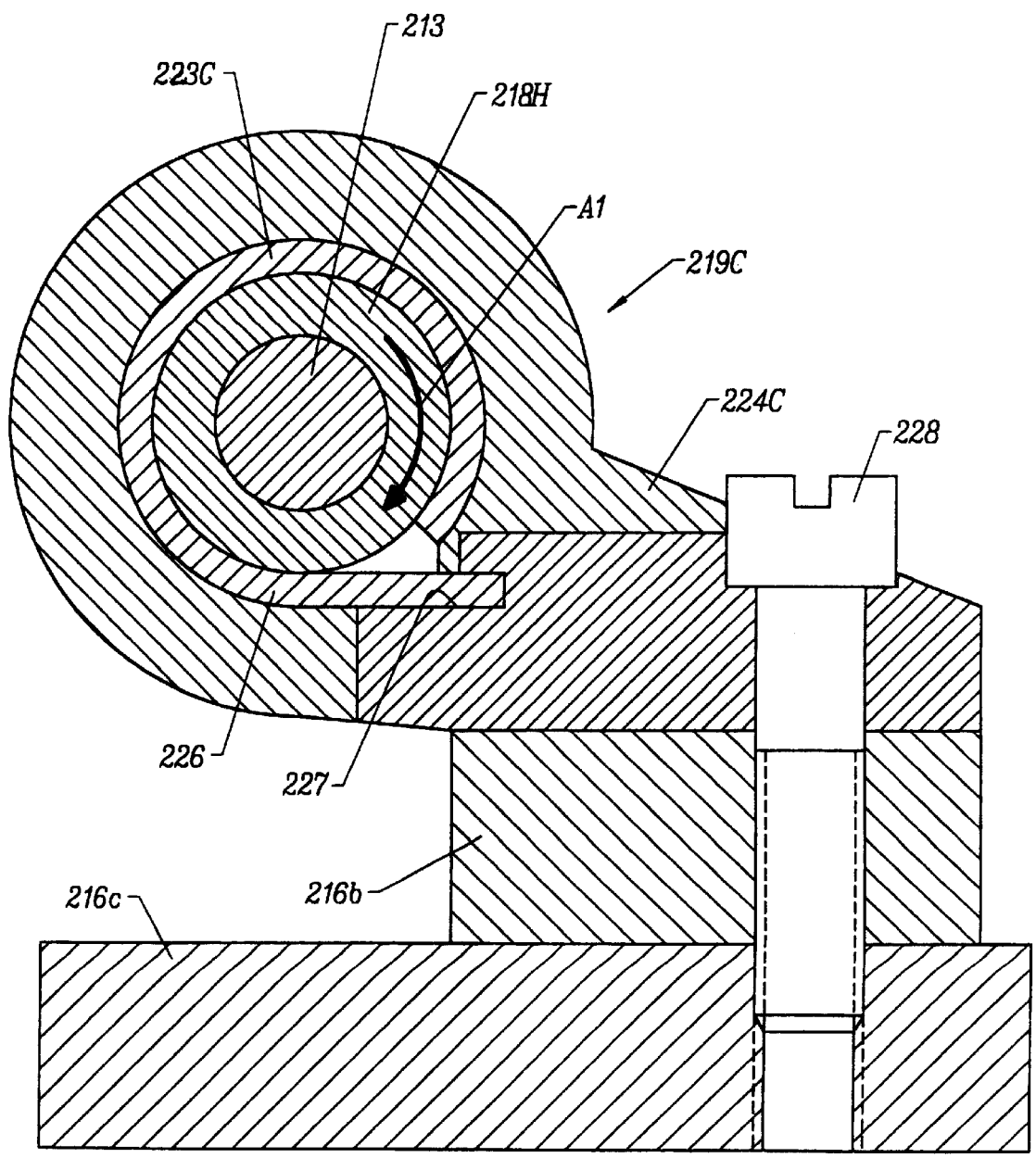
FIG. 4H is a cross sectional view of another one of the friction hinge structures showing another friction spring engaging another sleeve mounted on the torsion rod.

Another sleeve 218 (referred to as the cover sleeve 218C and shown on the right in FIG. 4B, and shown in FIG. 4G) surrounds the torsion rod 213 and is held fixed to the cover 204 by another clamp, referred to as a cover-sleeve clamp 222. An additional friction hinge structure 219H is mounted on an intermediate hatch mounting plate 216a between the hatch 207 and the other sleeve 218C and is also in a friction-engaging relationship with the other sleeve 218C. As the additional friction hinge structure 219H rotates with the hatch 207 and relative to the fixed sleeve 218C (i.e., clockwise as shown in FIGS. 4B and 4G, see arrow A2) the friction-engaging relationship further resists the clockwise, port-closing motion of the hatch 207 (arrow A2).

For clarity of illustration and description, in FIGS. 4B, 4C, 4E and 4F the sleeves 218C and 218H are shown extending toward each other from the respective cover-sleeve clamp 222 and hatch-sleeve clamp 221. In this manner, the separation of the sleeve 218C from the sleeve 218H is clearly shown. It is to be understood that in practice, each sleeve may extend from a respective edge 222E and 221E of the respective clamp 222 and 221 toward the respective clamp 214 and 217.

FIG. 4G shows the friction hinge structure 219H in detail as including the sleeve 218C mounted on the torsion rod 213. A friction spring 223H is wound at least partially around the sleeve 218C to define a helical shape such that the spring 223H engages a substantial amount of the outer surface of the sleeve 218C. The spring 223H is pre-formed to have a slightly smaller diameter than the outer diameter of the sleeve 218C. A spring housing 224H holds the spring 223H. A tab 226 of the spring 223H is received in a slot 227 of the housing 224H. A fastener 228 secures the housing 224H to the intermediate hatch mounting plate 216a and to the hatch mounting plate 216. The slot 227 prevents the spring 223H from being completely wrapped around the sleeve 218C. Such tendency to become completely wrapped would occur, for example, as the housing 224H and the hatch 207 are rotated clockwise relative to the sleeve 218C during closing of the hatch 207. With the spring 223H so partially wrapped and held, the spring 223H is effective during rotation of the hatch 207 in the clockwise direction shown in FIG. 4B (i.e., during the portclosing motion of the hatch 207) to cause the above-noted friction-engaging relationship to provide high resistance to that motion relative to the sleeve 218C, the sleeve 218C being held stationary on the cover 204 by the cover-sleeve clamp 222. Oppositely, during the port-opening motion of the hatch 207 the friction spring 223H tends to provide low resistance to the counterclockwise motion of the spring housing 224H and the hatch 207.

FIG. 4H shows the friction hinge structure 219C in detail as including the sleeve 218H mounted on the torsion rod 213. A friction spring 223C is wound at least partially around the sleeve 218H to define a helical shape such that the spring 223C engages a substantial amount of the outer surface of the sleeve 218H. A spring housing 224C holds the spring 223C. A tab 226 of the spring 223C is received in a slot 227 of the housing 224C. A fastener 228 secures the housing 224C to an intermediate cover mounting plate 216b and to the cover interface plate 216c. The slot 227 prevents the spring 223C from being completely wrapped around the sleeve 218H. Such tendency to become completely wrapped would occur, for example, as the hatch 207 and the sleeve 218H are rotated clockwise (arrow A1) relative to the spring 223C during closing of the batch 207. With the spring 223C so partially wrapped and held, the spring 223C is effective during rotation of the sleeve 218H and the hatch 207 in the clockwise direction (arrow A1) shown in FIG. 4H (i.e., during the port-closing motion of the hatch 207) to cause the above-noted friction-engaging relationship to provide high resistance to that hatch/sleeve motion relative to the spring 223C, the housing 224C and the spring 223C being held stationary on the cover 204 by the plates 216b and 216c. Oppositely, during the port-opening motion of the hatch 207 the friction spring 223C tends to provide low resistance to the counterclockwise motion of the sleeve 218H and the hatch 207.

It may be understood that the open-assist feature has the one aspect in which the torsion rod 213 assists in opening the hatch 207 by providing the torsional force in the direction opposite to the arrows A1 and A2 (i.e., in the opening direction to assist the service personnel). Further, the open-assist feature has the other aspect in which the tendency of the hatch 207 to close the port 209 under the weight of the hatch 207 is resisted by the above-noted friction-engaging relationships which provide the high resistance to the noted relative hatch closing motion. The friction-engaging relationships hold the hatch 207 at any angle between open and close without operator assistance.

FIG. 4E shows another embodiment of the present invention in which additional resistance may be provided to the noted relative motion. In particular, the one friction hinge structure 219C shown in FIG. 4C may be used with a second friction hinge structure 219C-2 shown in FIG. 4E to provide additional resistance to the noted relative motion. Alternatively or in addition, a second friction hinge structure 219H-2 of the type of friction hinge structure 219H shown in FIG. 4C may be provided adjacent to the friction hinge structure 219H (see dashed lines in FIG. 4E) to provide additional resistance to the noted relative motion.

The hinge bodies 212 are shown in FIGS. 5A–5D in conjunction with the intermediate hatch mounting plate 216 that provides a tolerance resistant, vacuum compliant hinge 229 for mounting the hatch 207 relative to the port 209 defined in the cover 204 such that the hatch 207 may close and open the port 209. The cover 204 is shown provided with a cover sealing surface 231. The hinge 229 may include the hinge body 212 mounted for rotation on the longitudinal axis of the rod 213, e.g., the body 212 is shown in the form of the clamp 217 secured to the intermediate hatch mounting plate 216. The axis is spaced from the cover sealing surface 231 by a dimension 232. The dimension 232 may be 0.032, and may have a manufacturing tolerance of about ±0.017, for example. The tolerance compliant hinge 229 may further include the intermediate hatch mounting plate 216 shown connecting the hinge body 217 to the hatch 207. The hatch 207 is provided with a hatch sealing surface 233 which cooperates with an O-ring 234 and the cover sealing surface 231. As described below, the hinge 229 between the hinge body 217 and the hatch 207 permits the hatch sealing surface 233 to sealingly seat on the cover sealing surface 231 notwithstanding the manufacturing tolerances described below.

The intermediate hatch mounting plate 216 is provided with a first bore 236 having a fastener axis 237 and a countersink bore 238 concentric with the fastener axis 237. The countersink bore 238 has a shoulder 239 having a depth dimension D extending in the hatch mounting plate 216. The value of the depth dimension D may be about 0.705, for example, and may have a manufacturing tolerance of about ±0.003, for example. The first bore 236 has a diameter that is small relative to the diameter of the countersink bore 238. A threaded bore 241 is provided in the hatch 207 aligned with the fastener axis 237 to secure a fastener 242 and thus hold the hatch 207 mounted to the intermediate hatch mounting plate 216. The head of the fastener 242 urges toward the shoulder 239 and compresses a spring assembly 244 composed of springs 246.

Other manufacturing tolerances of the hinge 229 relate to the distance G from the center of gravity of the hatch 207 to the left end of the hatch 207, which distance G may have a tolerance of about ±0.250, for example. Also, a distance A is provided from the left end of the hatch 207 to the fastener axis 237 of the hatch 207. The distance A may have a manufacturing tolerance of about ±0.050, for example. A thickness FA of the fastener 242 may have a manufacturing tolerance of about ±0.001, for example. Also, a thickness S of the spring assembly 244 may have a manufacturing tolerance of about ±0.007, for example. In addition, a relaxed diameter 0 of the O-ring 234 may have a manufacturing tolerance of about ±0.010 for example. Also, a thickness H of the hatch mounting plate 216 may have a manufacturing tolerance of about ±0.010, for example. Finally, a distance FD may be provided from the left end of the hatch 207 to a point representing the point at which a force $F_T$ is applied to the hatch 207, as described below, tending to move the hatch relative to the plate 216. The distance FD may have a manufacturing tolerance of about ±0.010, for example.

In the use of the hinges 229, the operator moves the hatch 207 into the closed position shown in FIG. 3 prior to vacuum operation of the chamber. Such initial closing loads the inner side of the O-ring 234, which is the side shown in FIGS. 5A–5D, and there is no angle between the plate 216 and the hatch 207 (as compared to the angles T2 and T1 shown in respective FIGS. 5D and 5C). The situation of no angle between the plate 216 and the hatch 207 would correspond to a non-vacuum compliant hinge, which would, for example, be one in which no relative motion is permitted between the hatch 207 and the plate 216. Such situation is not acceptable since the O-ring 234 is not evenly loaded.

As the operator applies force FT to the hatch 207, an angle T2 (FIG. 5D) is formed between the plate 216 and the hatch 207. As the angle T2 forms, the entire perimeter of the O-ring 234 becomes equally loaded. The amount of such equal loading is a function of the number and sizes of the springs 246 of the spring assemblies 244, and is referred to as pre-loading of the O-ring 234. To hold the equal loading, the claw clamps 206 (shown in FIG. 3) are tightened to secure the edge of the hatch 207 opposite to the hinges 229. The clamps 206 exert the force $F_\tau$ in place of the operator.

Figure 5A:
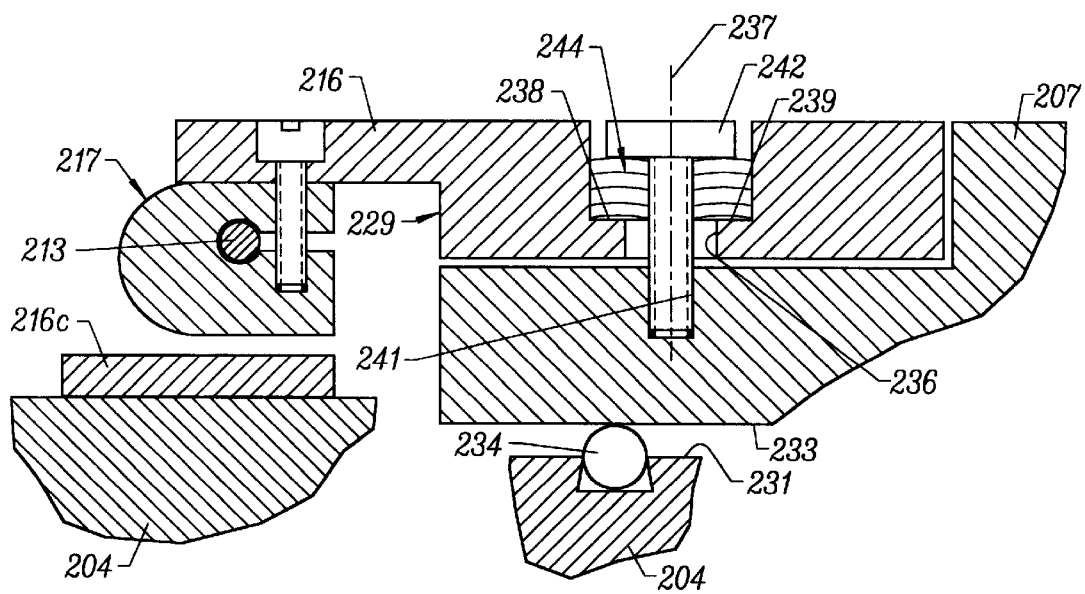
FIG. 5A is a cross-sectional view of one of the friction hinge structures having integral therewith a tolerance resistant and vacuum compliant connection of the present invention.
Figure 5B:
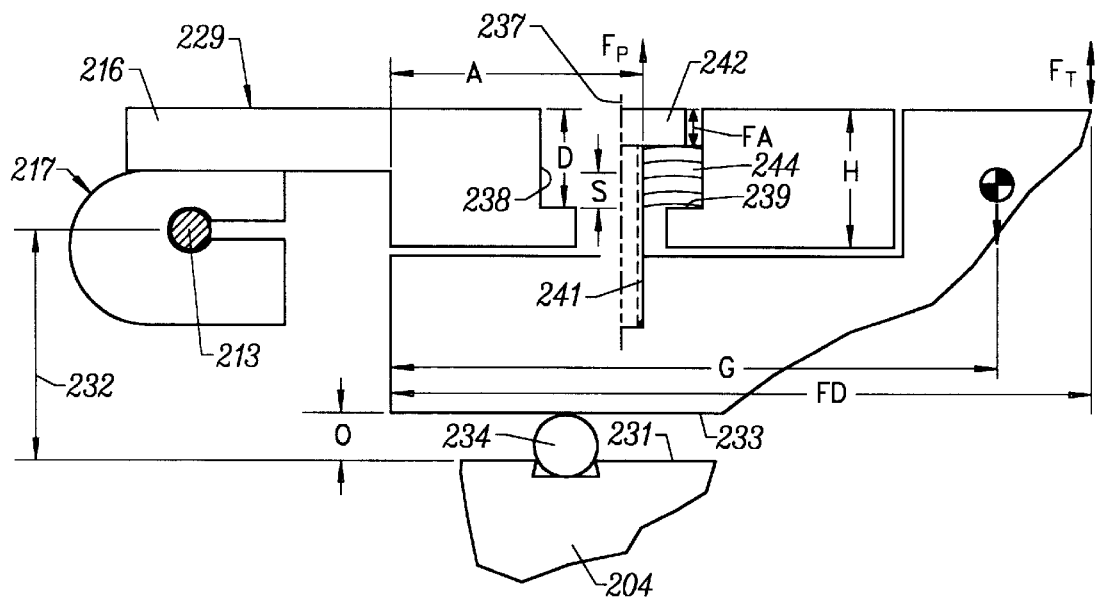
FIG. 5B is a schematic view similar to FIG. 5A showing dimensions of the tolerance resistant and vacuum compliant connection that have manufacturing tolerances.
Figure 5C:
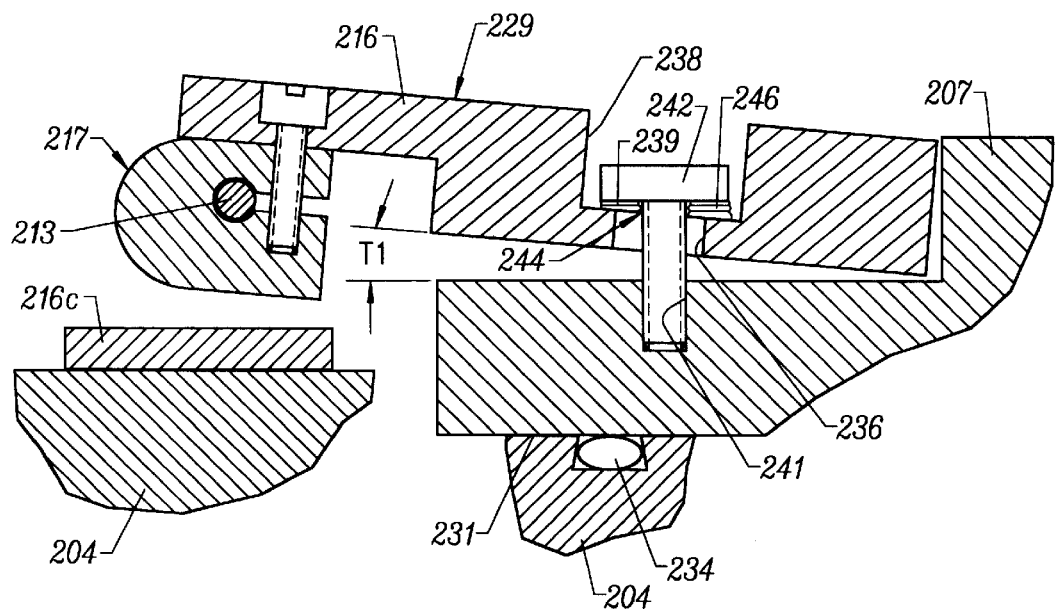
FIG. 5C is cross-sectional view similar to FIG. 5A showing both the tolerance resistant and the vacuum compliant aspects of the hinge of the present invention, in which the tolerance resistant and vacuum compliant connection allows the sealing surfaces of the hatch and the cover to be parallel and touch under vacuum in the chamber.
Figure 5D:
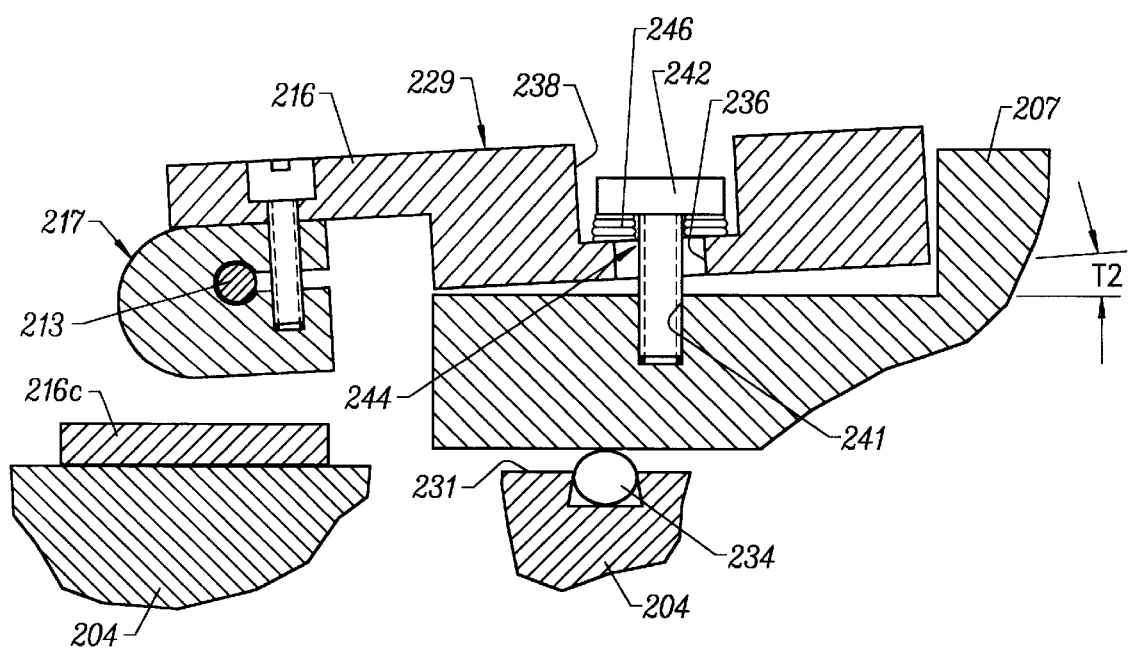
FIG. 5D is a cross-sectional view similar to FIG. 5C showing the hatch with the O-ring pre-loaded prior to the vacuum operation.

At this juncture, the closure of the hatch 207 appears as shown in FIG. 5D, wherein the sealing surfaces 231 and 233 are parallel, and the angle T2 is provided between the plate 216 and the hatch 207. Prior to vacuum operation, under all variations of the tolerances described with respect to FIG. 5B, the hinges 229 permit the angle T2 to exist.

With the sides of the O-ring 234 equally loaded, the vacuum operation commences. During the vacuum operation, the O-ring 234 is compressed until there is full contact between the sealing surfaces 231 and 233. As the chamber pumps from atmosphere to vacuum, the hinges 229 allow the hatch 207 to move from the position shown in FIG. 5D (at the angle T2 relative to the plate 216), to an intermediate position shown in FIGS. 5A and 5B, and then to a final position shown in FIG. 5C at the angle T1 relative to the plate 216). This transition occurs as the pre-loaded O-ring 234 (shown in FIG. 5D) fully compresses to the operational O-ring compression (FIG. 5C), wherein the sealing surfaces 231 and 233 are in full contact all the way around the cover 204. Since the hinges 229 permit the angle T2 to exist prior to vacuum operation and under all variations of the tolerances described with respect to FIG. 5B, the full range of relative motion between the plate 216 and the hatch 207 is permitted as indicated by the angles T2 becoming the angle T1, such that the sealing surfaces 231 and 233 seal in a tolerance resistant and vacuum compliant manner.

It may be understood then, that the hinge 229 normally urges the hatch 207 into parallel alignment with the plate 216 (FIG. 5A), and also allows relative motion between the plate 216 and the hatch 207 so that notwithstanding the noted manufacturing tolerances and chamber vacuum operation, for example, the hatch sealing surface 233 will be positioned parallel to the cover sealing surface 231 (FIGS. 5C and 5D).

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A hinge assembly for mounting a hatch relative to a port defined in a cover of a vacuum chamber such that the hatch may close and open the port, comprising:

a torsion rod mounted between the port and the hatch, the rod being in torsion when the hatch is in a closed position relative to the port to assist port-opening motion of the hatch;

at least one sleeve surrounding the rod and movable with the hatch; and friction hinge structures between the cover and the at least one sleeve, the hinge structures being in a friction-engaging relationship with the at least one sleeve to resist port-closing motion of the hatch.

2. A hinge assembly as recited in claim 1, further comprising:

the friction hinge structures comprising at least one friction spring wound at least partially around the at least one sleeve in a first direction so that during the port-closing motion of the hatch the at least one friction spring tends to provide high resistance to relative motion between the at least one sleeve and the at least one friction spring, whereas during the port-opening motion of the hatch the at least one friction spring tends to provide low resistance to the relative motion between the at least one sleeve and the at least one friction spring.

3. A hinge assembly as recited in claim 2, further comprising:

a first clamp block attaching a first end of the torsion rod to the cover for securing the first end of the rod against rotation relative to the cover; and a second clamp block attaching a second end of the torsion rod to the hatch for rotation relative to the first end during the port-opening motion and the port-closing motion of the hatch.

4. A hinge assembly as recited in claim 3, whereas the at least one sleeve comprises first and second sleeves, further comprising:

a third clamp block attaching the first sleeve against rotation relative to the cover;

a fourth clamp block attaching the second sleeve to the hatch for rotation relative to the torsion rod during the port-opening motion and the port-closing motion of the hatch;

the friction hinge structures further comprising:

a first friction spring wound at least partially around the first sleeve in the first direction so that during the port-closing motion of the hatch the first friction spring tends to provide high resistance to relative motion between the first sleeve and the first friction spring, whereas during the port-opening motion of the hatch the first friction spring tends to provide low resistance to the relative motion between the first sleeve and the first friction spring; and a second friction spring wound at least partially around the second sleeve in a second direction opposite to the first direction so that during the port-closing motion of the second sleeve the second friction spring tends to provide high resistance to the port-closing motion of the second sleeve whereas during the port-opening motion of the batch the second friction spring tends to provide low resistance to the port-opening motion of the second sleeve.

5. A hinge assembly as recited in claim 4, further comprising:

the first friction spring being attached to the hatch.

6. A hinge assembly as recited in claim 4, further comprising:

the second friction spring being attached to the cover.

7. A hinge assembly as recited in claim 1, further comprising:

the at least one sleeve comprising first and second sleeves mounted on the torsion rod, the first sleeve being fixed to the hatch, the second sleeve being fixed to the cover;

the friction hinge structures further comprising:
- a first friction spring wound at least partially around the first sleeve in the first direction so that during the port-closing motion of the hatch the first friction spring tends to provide high resistance to the corresponding motion of the first sleeve whereas during the port-opening motion of the hatch the first friction spring tends to provide low resistance to the corresponding motion of the first sleeve; and
- a second friction spring wound at least partially around the second sleeve in a second direction opposite to the first direction so that during the port-closing motion of the second sleeve the second friction spring tends to provide high resistance to the corresponding motion of the second sleeve whereas during the port-opening motion of the hatch the second friction spring tends to provide low resistance to the corresponding motion of the second sleeve.

8. A method of making a hinge assembly for mounting a hatch relative to a port defined in a cover of a vacuum chamber, the hatch closing and opening the port, comprising the operations of:
- mounting a torsion rod between the port and the hatch with the rod in torsion when the hatch is in a closed position relative to the port to assist port-opening motion of the hatch;
- mounting at least one sleeve surrounding the rod; and
- placing at least one friction hinge structure between the cover and the at least one sleeve in a friction-engaging relationship with the at least one sleeve to resist port-closing motion of the hatch.

9. A method as recited in claim 8, further comprising:
- providing the friction hinge structure comprising at least one friction spring wound at least partially around the at least one sleeve in a first direction so that during the port-closing motion of the hatch the at least one friction spring tends to provide high resistance to the corresponding motion of the at least one sleeve whereas during the port-opening motion of the hatch the at least one friction spring tends to provide low resistance to the corresponding motion of the at least one sleeve.

10. A method as recited in claim 9, further comprising:
- providing the friction hinge structure further with a first clamp block attaching a first end of the torsion rod to the cover for securing the first end of the rod against rotation relative to the cover; and
- providing the friction hinge structure further with a second clamp block attaching a second end of the torsion rod to the hatch for rotation relative to the first end during the port-opening motion and the port-closing motion of the hatch.

11. A method as recited in claim 10, further comprising:
- providing the at least one sleeve in the form of first and second sleeves;
- providing a third clamp block attaching the first sleeve against rotation relative to the cover;
- providing a fourth clamp block attaching the second sleeve to the hatch for rotation relative to the torsion rod during the port-opening motion and the port-closing motion of the hatch;
- providing a first friction spring of the friction hinge structures wound at least partially around the first sleeve in the first direction so that during the port-closing motion of the hatch the first friction spring tends to provide high resistance to the corresponding motion of the first sleeve whereas during the port-opening motion of the hatch the first friction spring tends to provide low resistance to the corresponding motion of the first sleeve; and
- providing a second friction spring of the friction hinge structures wound at least partially around the second sleeve in a second direction opposite to the first direction so that during the port-closing motion of the second sleeve the second friction spring tends to provide high resistance to the corresponding motion of the second sleeve whereas during the port-opening motion of the hatch the second friction spring tends to provide low resistance to the corresponding motion of the second sleeve.

12. A method recited in claim 11, further comprising:
attaching the first friction spring to the hatch.

13. A method as recited in claim 11, further comprising:
attaching the second friction spring to the cover.

14. A method as recited in claim 8, further comprising:
- providing the at least one sleeve comprising first and second sleeves mounted on the torsion rod;
- fixing the first sleeve to the hatch;
- fixing the second sleeve to the cover; and
- providing the friction hinge structures in the form of a first friction spring wound at least partially around the first sleeve in a first direction so that during the port-closing motion of the hatch the first friction spring tends to provide high resistance to the corresponding motion of the first sleeve whereas during the port-opening motion of the hatch the first friction spring tends to provide low resistance to the corresponding motion of the first sleeve; and
- further providing the friction hinge structures in the form of a second friction spring wound at least partially around the second sleeve in a second direction opposite to the first direction so that during the port-closing motion of the second sleeve the second friction spring tends to provide high resistance to the corresponding motion of the second sleeve whereas during the port-opening motion of the hatch the second friction spring tends to provide low resistance to the corresponding motion of the second sleeve.

15. A tolerance resistant and vacuum compliant hinge for mounting a hatch relative to a port defined in a cover of a vacuum chamber such that the hatch may close and open the port, the cover being provided with a cover sealing surface, the hinge comprising:
- a hinge body mounted for rotation on a hinge axis spaced from the cover sealing surface, the hinge axis having a manufacturing tolerance; and
- a tolerance resistant and vacuum compliant connector between the hinge body and the hatch for permitting the hatch to sealingly seat on the cover sealing surface notwithstanding the hinge axis manufacturing tolerance and vacuum operations in the vacuum chamber.

16. A hinge as recited in claim 15, further comprising:
the hatch having a hatch sealing surface;
a connector body between the hinge body and the hatch; and a spring assembly for urging the hatch toward the connector body while allowing relative motion between the connector body and the hatch so that notwithstanding manufacturing tolerances of the connector body the hatch sealing surface will be positioned parallel to the sealing surface of the cover.

17. A hinge as recited in claim 15, further comprising:

the connector comprising:

a connector body having a first bore provided with a fastener axis and a countersunk bore concentric with the fastener axis, the countersunk bore having a shoulder at a depth in the connector body, the depth having a manufacturing tolerance;

the hatch being provided with a threaded bore concentric with the fastener axis and with a sealing surface;

a fastener threaded into the threaded bore for connecting the connector body to the hatch, the fastener having a shoulder with a depth having a manufacturing tolerance; and a spring assembly on the fastener for urging the hatch toward the connector body while allowing relative motion between the connector body and the hatch so that notwithstanding the manufacturing tolerances and the vacuum operations the sealing surface of the hatch will be positioned parallel to the sealing surface of the cover.

18. A tolerance resistant and vacuum compliant hinge for mounting a hatch relative to a port defined in a cover of a vacuum chamber such that the hatch may close and open the port, the cover being provided with a cover sealing surface, the hinge comprising:

a torsion rod mounted between the port and the hatch on a hinge axis, the rod being in torsion when the hatch is in a closed position relative to the port to assist port-opening motion of the hatch;

at least one sleeve surrounding the rod and movable with the hatch;

friction hinge structures between the cover and the at least one sleeve, the hinge structures being in a friction-engaging relationship with the at least one sleeve to resist port-closing motion of the hatch;

a hinge body mounted for rotation on the hinge axis spaced from the cover sealing surface, the hinge axis having a manufacturing tolerance; and a tolerance resistant and vacuum compliant connector between the hinge body and the hatch so that at the end of the port-closing motion the hatch sealingly seats on the cover sealing surface notwithstanding manufacturing tolerances of the hinge body and the connector.

19. A hinge as recited in claim 18, the tolerance compliant connector further comprising:

a connector body between the hinge body and the hatch; and a spring assembly for urging the hatch toward the connector body while allowing relative motion between the connector body and the batch so that notwithstanding the manufacturing tolerances and the vacuum operations the sealing surface of the hatch will be positioned parallel to the sealing surface of the cover.

20. A hinge for mounting a hatch relative to a port defined in a cover of a vacuum chamber such that the hatch may close and open the port, the cover being provided with a cover sealing surface, the hinge comprising:

a rod mounted on the cover for defining a hinge axis spaced from the cover sealing surface, the hinge axis having a manufacturing tolerance;

a hinge body mounted for rotation on the rod;

a connector body having a first bore provided with a fastener axis and a countersunk bore concentric with the fastener axis, the countersunk bore having a shoulder at a depth in the connector body, the depth having a manufacturing tolerance;

the hatch being provided with a threaded bore concentric with the fastener axis and a sealing surface;

a fastener threaded into the threaded bore for connecting the connector body to the hatch, the fastener having a shoulder with a depth having a manufacturing tolerance; and a spring assembly on the fastener between the shoulder of the fastener and the shoulder of the countersunk bore for urging the hatch toward the connector body while allowing relative motion between the connector body and the hatch so that notwithstanding the manufacturing tolerances and vacuum operations in the vacuum chamber the sealing surface of the hatch will be positioned parallel to the sealing surface of the cover.

* * * * *